United States Patent

Yung et al.

[11] Patent Number: 6,075,280
[45] Date of Patent: Jun. 13, 2000

[54] PRECISION BREAKING OF SEMICONDUCTOR WAFER INTO CHIPS BY APPLYING AN ETCH PROCESS

[75] Inventors: Hao-Chieh Yung; Gene Jing-Chiang Chang, both of Hsinchu, Taiwan

[73] Assignee: Winbond Electronics Corporation, Hsinchu, Taiwan

[21] Appl. No.: 09/224,455

[22] Filed: Dec. 31, 1998

Related U.S. Application Data

[60] Provisional application No. 60/070,227, Dec. 31, 1997.

[51] Int. Cl.[7] .......................... H01L 23/544; H01L 29/06
[52] U.S. Cl. .......................... 257/620; 257/622; 257/797; 438/460; 438/462
[58] Field of Search .................................. 257/620, 797, 257/622; 438/460, 462

[56] References Cited

U.S. PATENT DOCUMENTS

| | | | |
|---|---|---|---|
| 3,542,266 | 11/1970 | Woelfle | 225/2 |
| 4,567,646 | 2/1986 | Ishinawa et al. | 29/576 W |
| 4,604,161 | 8/1986 | Araghi | 156/645 |
| 4,814,296 | 3/1989 | Jedlicka et al. | 437/226 |
| 5,128,282 | 7/1992 | Ormond et al. | 437/226 |

FOREIGN PATENT DOCUMENTS

| | | |
|---|---|---|
| 9008700 | 1/1984 | Japan . |
| 4215456 | 8/1992 | Japan . |

*Primary Examiner*—William Mintel
*Attorney, Agent, or Firm*—Bo-In Lin

[57] ABSTRACT

This invention discloses a novel method for separating a semiconductor wafer into a plurality of integrated circuit (IC) chips. The separation is carried out along scribe lines between the IC chips. The method includes steps of (a) forming a photoresist layer on the semiconductor wafer; (b) performing a photolithography process for removing the photoresist layer above the scribe lines between the IC chips; (c) performing an etch process for removing a dielectric layer above the scribe lines between the IC chips for exposing the scribe lines on the semiconductor wafer; (d) performing a wet chemical etch process to anisotropically etch the semiconductor wafer into a V-shaped groove in the scribe lines; and (e) applying a mechanical force to break the semi-conductor wafer along the V-shaped grooves in the scribe lines thus separating the semiconductor wafer into a plurality of IC chips.

9 Claims, 1 Drawing Sheet

PRECISION BREAKING OF SEMICONDUCTOR WAFER INTO CHIPS BY APPLYING AN ETCH PROCESS

This Application claimed a priority filing date of Dec. 31, 1997 benefited from a Provisional Application 60/070,277 filed on Dec. 31, 1997 by the same inventors of this Formal Application.

BACKGROUND OF THE INVENTION

1. Field of the Invention

This invention relates generally to the fabrication method for manufacturing the semiconductor devices supported on a silicon substrate. More particularly, this invention relates to novel and improved processing steps to break the silicon wafer into a plurality of semi-conductor chips to eliminate the wastes of wafer surface areas and edge damages such as chipping or cracks resulting from current dicing technique. The breaking process can also be more precisely conducted.

2. Description of the Prior Art

The use of dicing saw techniques for cleaving the semiconductor chips or dies from a silicon wafer resulting in wastes of precious and limited wafer surface areas. Additionally, the techniques often lead to die edge chipping or cracks which eventually cause a reduction in production yield, a cost increase in manufacture and degradation in product reliability. The dicing saw techniques involve the use of rotating diamond wheel to scribe the wafers and then break the wafer into a plurality of small pieces, i.e., the chips. The techniques may also involve the use of a to semi-scribe the wafers and then break the wafers into chips by rolling a rubber wheel on the wafers. These approaches may includes laser scribing or mechanical scribing and cleave. In addition to these methods, there are several prior art patents with various attempts to solve the problems associated with dicing techniques and to provide improved IC chip productivity by applying a better wafer breaking process.

In U.S. Pat. No. 5,458,269, entitled "Frangible Semiconductor Wafer Dicing Method Which Employs Scribing and Breaking" (issued on Oct. 17, 1995), Loomis disclosed a method to separate a semiconductor wafer. The method is carried out by applying a controlled, adjustable stain and strain rate by use of a break wheel to break a frangible semiconductor wafer around previously placed scribe lines formed along surface of the wafer. Special break wheels are applied for applying a resilient breaking force to the wafer in a region straddling the scribe line. The break wheels are used with a tilted surface having a break edge with which the scribe line is aligned prior to the application of the breaking force. The tilted surface is adjustable to provide a variable maximum strain limit. Difficulties of waste of wafer areas are not solved by this invention as it is required extra wafer areas must be used for placing the breaking wheels for the dicing operation.

In U.S. Pat. No. 5,310,104, entitled "Method and Apparatus for Cleaving A Semiconductor Wafer into Individual Die and Providing for Low Stress Die Removal" (issued on May 10, 1994), Zaidel et al. disclose a method and apparatus for cleaving a semiconductor into die. The method is performed by mounting the wafer on an adherent resilient air impermeable membrane which has a flat surface. Cleaving is performed by using air pressure to inflate the membrane to cause bending and tensile stresses on the wafer brought about by its adhesion to the inflating membrane. The stresses cleave the wafer along the scribe marks to form individual die. The die may be easily removed by the application of a vacuum to the membrane. The method of Zaidel et al. requires complex vacuum system and membrane process apparatuses. Production cost and time may also be increased due to the complicated steps of placing the wafer onto the membrane and other additional steps required to achieve the cleaving of the wafers.

In U.S. Pat. No. 5,521,125, entitled "Precision Dicing of Silicon Chips from A Wafer" (issued on May 28, 1996), Ormond et al. disclose a dicing technique for cleaving semiconductor wafers. The dicing technique is carried out by depositing successive layers of silicon oxide in a first and second regions on a surface of a silicon wafer for defining a street having no oxide layers. The oxide layers forming a vertical walls defining the boundary of the streets. A shock absorbing material is deposited in the street forming a concave meniscus. The shock absorbing materials can retard the trajectories of the silicon particles and prevent the particles to set into motion during the process when the wafer is diced into chips. Ormond et al. provide a technique to improve the cleaving of the semiconductor by dicing process. The difficulties arising from applying dicing technology, e.g., wastes of wafer spaces reserved for dicing operation are still not resolved by this patented disclosure.

In U.S. Pat. No. 5,157,001, entitled "Method of Dicing Semiconductor Wafer Along Protective Film Formed in Scribe Lines" (issued on Oct. 20, 1992), Sakuma discloses a dicing technique by forming a protective film buried in the wafer along the scribe lines. The protective film will then protect the edge along the breaking lines such that cracks or damages of the semiconductor chips along the braking edges can be prevented. Again, using the protective film as that disclosed in this patent does not solve the difficulties encountered by applying a dicing method. Similarly, in U.S. Pat. No. 5,314,844, entitled "Method for Dicing a Semiconductor Wafer" (issued on May 24, 1994), Imamura discloses a method for dicing a wafer of III-V compound material without causing chipping and cracks. The method includes a step of forming the scribe lines orthogonal to a crystal place (011) by scribing using grinding and cutting method. Wastes of semiconductor wafer space by applying a grinding and cutting processes is till present in the patented technique.

U.S. Pat. No. 4,179,174 discloses a semiconductor wafer dicing technique in which recessed grooves are formed into the wafer by an etching technique, along lines corresponding to the boundaries of adjacent chips. The surfaces of these etched grooves are then coated with a resin, and the semiconductor is then severed into individual chips. Due to the special technical difficulties typically encountered in the etching process, such technique is however considered as undesirable. Particularly, the undercutting of the masked areas and rounding the bottom of the separation pattern. Due to these difficulties, the etch process is considered as not useful for cleaving the wafer since proper cleaves cannot be obtained when etching processes are employed. (Please refer to the last paragraph in Background of the Invention" Section in U.S. Pat. No. 4,729,971). Because of this teaching away from using etch process for separating a wafer into individual chip, a person of ordinary skill in the art would not consider etching process can provide a feasible solution to the difficulties generally encountered in dicing the wafer into chips.

Therefore, a need still exists in the art of integrated circuit (IC) manufacture for a novel and improved technique to separate the wafer into individual chips. Preferably, this novel technique can be easily incorporated and conveniently applicable in an IC manufacturing process without complicate processing steps. More importantly, it is desirable that the wafer cleaving technique can achieve savings of wafer space to reduce wastes of precious semiconductor surface areas required to be reserved for typical dicing processes. Additionally, the new techniques would provide a method to overcome the undercutting and bottom-rounding difficulties faced by the industry when etching process is applied such that the quality of the IC chips and production cost can be improved by applying the cleaving technology disclosed in this invention.

SUMMARY OF THE PRESENT INVENTION

It is therefore an object of the present invention to provide a novel and improved manufacture process for separating a semiconductor wafer into many individual IC chips without requiring wastes of wafer areas and significant reducing edge chipping and cracks of the IC. Therefore, the aforementioned difficulties and limitations encountered in the prior art can be overcome.

Specifically, it is an object of the present invention to provide a novel manufacture process by applying an improved etching process to form grooves. The grooves are highly inducible to breaking in the scribe lines by applying precisely controllable etch processing steps to form V-shaped grooves along the scribe lines. The stress and strain asserted to the edges of the IC chips can be minimized and the concerns of the unreliable chip production can be resolved.

Another object of the present invention is to provide a novel manufacture process by applying an improved etching process to form V-shaped grooves which are highly inducible to breaking in the scribe lines by applying precisely controllable etch processing steps whereby the wafer areas required for cleaving the wafer can be significantly reduced and the wastes of the wafer areas can be minimized.

Another object of the present invention is to provide a novel manufacture process by applying an improved etching process to form grooves which are highly inducible to breaking in the scribe lines by applying precisely controllable etch processing steps to align the V-shaped grooves along certain crystal direction whereby the separating of the wafer into chips can be precisely controlled with minimum shift.

Another object of the present invention is to provide a novel manufacture process by applying an improved etching process to form V-shaped grooves which are highly inducible to breaking in the scribe lines by applying precisely controllable etching processing steps whereby the concerns of undercutting or round-bottom geometry in applying etch process can be resolved and the etch process can be effectively applied for performing the cleaving of the semiconductor wafers.

Briefly, in a preferred embodiment, the present invention discloses a method for separating a semiconductor wafer into a plurality of integrated circuit (IC) chips, along scribe lines between the IC chips. The method includes the steps of (a) forming a photo-resist layer on the semiconductor wafer; (b) performing a photolithography process for removing the photo-resist layer above the scribe lines between the IC chips; (c) performing an etch process for removing a dielectric layer above the scribe lines between the IC chips for exposing the scribe lines on the semiconductor wafer; (d) performing a wet chemical etch process to anisotropically etch the semiconductor wafer into a V-shaped groove in the scribe lines; and (e) applying a mechanical force to break the semiconductor wafer along the V-shaped grooves in the scribe lines thus separating the semiconductor wafer into a plurality of IC chips. In a preferred embodiment, the step of performing a wet chemical etch process includes a step of employing an etchant solution containing potassium hydroxide, propanol and DI water for etching the V-shaped grooves in the scribe lines for a semiconductor wafer with a [1,0,0] crystal orientation. In yet another preferred embodiment, the step of performing a wet chemical etch process includes a step of employing an etchant solution containing potassium hydroxide and DI water for etching the V-shaped grooves in the scribe lines for a semiconductor wafer with a [1,1,0] crystal orientation.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
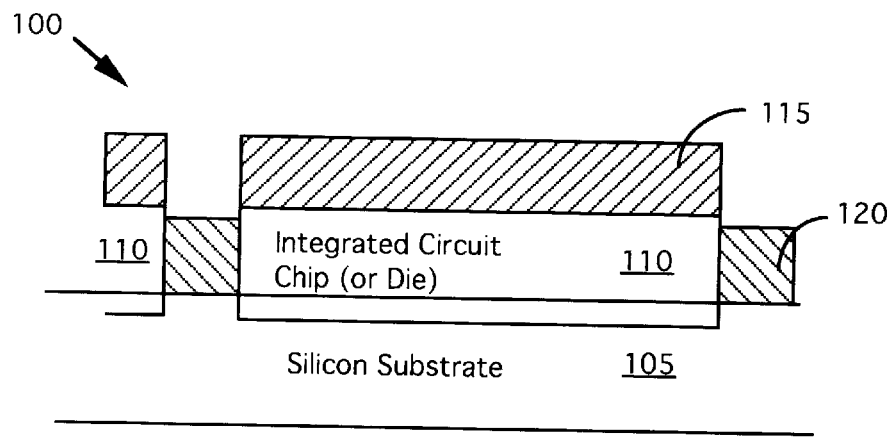
FIG. 1 is a cross sectional view of a semiconductor wafer with a photo-resist layer formed thereon and the photo-resist layer removed from the scribe lines.
Figure 2:
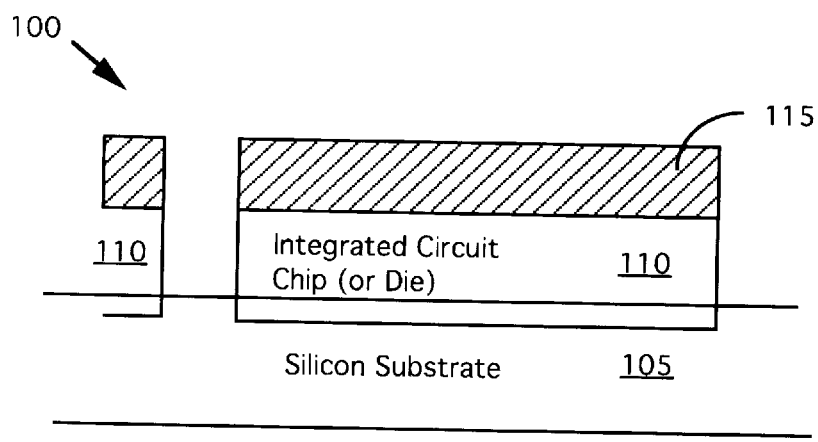
FIG. 2 is a cross sectional view of a semiconductor wafer with a photo-resist layer formed thereon and the dielectric layer removed from the scribe lines.
Figure 3:
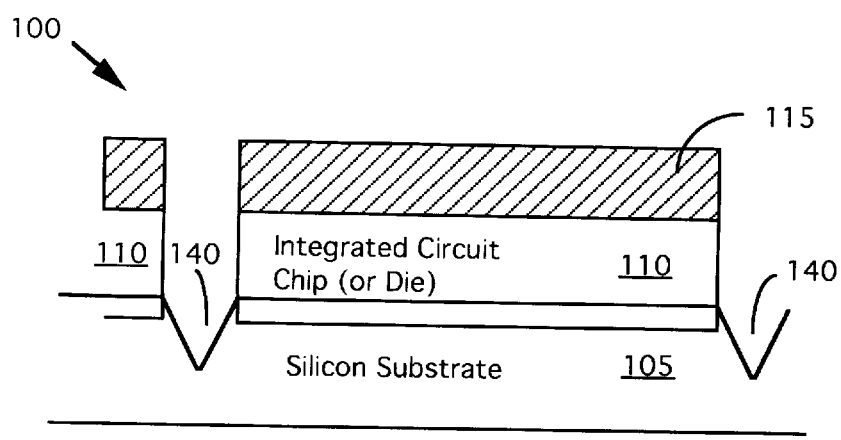
FIG. 3 is a cross sectional view of a semiconductor wafer with a photo-resist layer formed thereon and a V-shaped groove etched in the scribe lines.

Referring to FIGS. 1 to 3 for a series of cross sectional views for illustrating the processing steps to precisely separate a semiconductor wafer into many integrated circuit (IC) chips. As shown in FIG. 1, after the integrated circuit (IC) manufacture processes are completed on the wafer 100 including the device, the interconnect lines, the passivation layer and other circuit or packaging elements on the wafer, (details not shown for the purpose of clarity and brevity). A plurality of IC chips 110 completed on the wafer 100 are supported on a semiconductor substrate 105. A spin on photo-resist layer 115 is first deposited on the wafer 100 and a photolithography process is carried out to clear and remove the photoresist 115 from space above the scribe line areas. And, a dielectric layer 120 underneath the removed photoresist layer 115 is now left in the areas defined by the scribe line.

Referring to FIG. 2, the dielectric layer 120 in the scribe line areas is removed by the use of either a dry etch or wet etch process. The dry or wet etch process may also be employed to remove the metal films which may remain as residual traces underneath the dielectric layer 120. By removing the dielectric layer 120 and possibly the metal films or other underlying layers previously deposited in the scribe lines, the top surface of the supporting substrate 105 is exposed.

With the dielectric layer 120 and residual metal films removed and the top surface of the silicon substrate exposed, a wet chemical etch is carried out to form a V-shaped groove as that shown in FIG. 3. For a silicon wafer 100 which has a crystal structure with crystalline orientation in a [1,0,0] direction, the solution employed for the wet chemical etch contains potassium hydroxide, normal propanol and DI water. In a preferred example of this method, an etch solution for a [1,1,0] silicon wafers composed of potassium hydroxide and DI water. The width of the scribe lines can now be reduced to 50 micrometers (μm) and the depth of the grooves can be flexibly and precisely controlled depending on the thickness of the wafer.

With the V-shaped grooves 140 now formed in the substrate near the areas of the scribe lines 120, as that shown in FIG. 3, a mechanical force can be applied to break the wafer into separated chips. The breaking of the wafer can be safely conducted without the difficulties of cracking or chipping along the edge of scribing lines 120. The substrate under the tip of the V-grooves 120 becomes a natural line of separation. Before applying the mechanical force to separate the wafer 100, the wafer can be adhered on an adhesive membrane and the mechanical force can be applied by either asserting a air pressure or employing a roller over the wafer 100.

According to FIGS. 1 to 3 and above descriptions, this invention discloses a semiconductor wafer 100 supporting a plurality of integrated circuit (IC) chips 110. The wafer 100 includes a photoresist layer 115 overlying the plurality of integrated circuit chips 110 on the semiconductor wafer. The semiconductor wafer 100 further includes a plurality of patterned gaps in the photoresist layer 115 opened between the IC chips 110. The wafer 100 further includes anisotropically etched V-shaped grooves 140 disposed in each of the pattern gaps below the integrated circuit chips 110 thus constituting a V-shaped scribe lines provided for separating the wafer 100 into a plurality of individual IC chips. In a preferred embodiment, the anisotropically etched V-shaped grooves 140 disposed in each of the pattern gaps below the integrated circuit chips thus constituting a V-shaped scribe lines are scribe lines for a semiconductor wafer with a [1,0,0] crystal orientation. In another preferred embodiment, the anisotropically etched V-shaped grooves disposed in each of the pattern gaps below the integrated circuit chips thus constituting a V-shaped scribe lines are scribe lines for a semiconductor wafer with a [1,1,0] crystal orientation.

This invention further discloses an integrated circuit (IC) chip 110 supported on a semi-conductor substrate 105, separated from a semiconductor wafer 100. The IC chip includes an edge surface surrounding the IC chip 110 on the semiconductor substrate 105, the edge surface constituting a down-slope surface defined by breaking from an anisotropically etched V-shaped groove 140 etched on the semiconductor wafer. In a preferred embodiment, the edge surface surrounding the IC chip on the semiconductor substrate is an edge surface broken from a scribe line formed in a semiconductor wafer with a [1,0,0] crystal orientation. In another preferred embodiment, the edge surface surrounding the IC chip on the semiconductor substrate is an edge surface broken from a scribe line formed in a semiconductor wafer with a [1,1,0] crystal orientation. In a preferred embodiment, the integrated circuit chip further has a side-edge surface constituting a non-smooth mechanically broken side-edge surface surrounding the IC chip 110.

According to the above description, a method for separating a semiconductor wafer into a plurality of integrated circuit (IC) chips along scribe lines between the IC chips is disclosed. The method includes steps of (a) forming a photoresist layer 115 on the semiconductor wafer 105; (b) performing a photolithography process for removing the photoresist layer 115 above the scribe lines between the IC chips 110; (c) performing an etch process for removing a dielectric layer 120 above the scribe lines between the IC chips 110 for exposing the scribe lines on the semiconductor wafer; (d) performing a wet chemical etch process to anisotropically etch the semiconductor wafer into a V-shaped groove 140 in the scribe lines; and (e) applying a mechanical force to break the semiconductor wafer along the V-shaped grooves 140 in the scribe lines thus separating the semiconductor wafer into a plurality of IC chips. In a preferred embodiment, the step of performing a wet chemical etch process includes a step of employing an etchant solution containing potassium hydroxide, propanol and DI water for etching the V-shaped grooves 140 in the scribe lines for a semiconductor wafer with a [1,0,0] crystal orientation. In yet another preferred embodiment, performing a wet chemical etch process includes a step of employing an etchant solution containing potassium hydroxide and DI water for etching the V-shaped grooves 140 in the scribe lines for a semiconductor wafer with a [1,1,0] crystal orientation.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A semiconductor wafer supporting a plurality of integrated circuit (IC) chips comprising:

a photoresist layer overlying said plurality of integrated circuit chips on said semiconductor wafer;

a plurality existing scribe lines and said photoresist layer further includes a plurality of patterned gaps aligned with said plurality of existing scribe lines in said photoresist layer opened between said IC chips;

said wafer further includes anisotropically etched V-shaped grooves etched in each of said existing scribe lines below said integrated circuit chips provided for separating said wafer into a plurality of individual IC chips.

2. The semiconductor wafer of claim 1 wherein:

said anisotropically etched V-shaped grooves etched in said existing scribe lines below said integrated circuit chips is etched in a semiconductor wafer with a [1,0,0] crystal orientation.

3. The semiconductor wafer of claim 2 wherein:

said anisotropically etched V-shaped grooves etched in said existing scribe lines below said integrated circuit chips is etched in a semiconductor wafer with a [1,1,0] crystal orientation.

4. An integrated circuit (IC) chip supported on a semiconductor substrate, separated from a semiconductor wafer, comprising:

an edge surface surrounding said IC chip on said semiconductor substrate, said edge surface includes a scribe line cutting edge and a down-slope surface below said scribe line cutting edge and said down slope surface is defined by breaking from an anisotropically etched V-shaped groove etched on said semiconductor wafer below said scribe line cutting edge.

5. The integrated circuit chip of claim 4 wherein:

said edge surface surrounding said IC chip on said semiconductor substrate is an edge surface broken from said V-shaped groove below said scribe line cutting edge formed in a semiconductor wafer with a [1,0,0] crystal orientation.

6. The semiconductor wafer of claim 4 wherein:

said edge surface surrounding said IC chip on said semiconductor substrate is an edge surface broken from said V-shaped groove below said scribe line cutting edge formed in a semiconductor wafer with a [1.1,0] crystal orientation.

7. The integrated circuit chip of claim 4 further comprising:
a side-edge surface includes a smooth scribe-line cutting surface and a non-smooth mechanically broken side-edge surface below said scribe-line cutting surface surrounding said IC chip.

8. The semiconductor wafer of claim 5 wherein:
a side-edge surface includes a smooth scribe-line cutting surface and a non-smooth mechanically broken side-edge surface below said scribe-line cutting surface surrounding said IC chip.

9. The semiconductor wafer of claim 6 wherein:
a side-edge surface includes a smooth scribe-line cutting surface and a non-smooth mechanically broken side-edge surface below said scribe-line cutting surface surrounding said IC chip.

* * * * *